(12) United States Patent
Kishimoto et al.

(10) Patent No.: US 10,581,028 B2
(45) Date of Patent: Mar. 3, 2020

(54) METHOD FOR PRODUCING ORGANIC ELECTROLUMINESCENT DISPLAY DEVICE

(71) Applicant: Sakai Display Products Corporation, Sakai-shi, Osaka (JP)

(72) Inventors: Katsuhiko Kishimoto, Osaka (JP); Takuji Kato, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 7 days.

(21) Appl. No.: 15/780,298

(22) PCT Filed: Nov. 29, 2017

(86) PCT No.: PCT/JP2017/042912
§ 371 (c)(1),
(2) Date: May 31, 2018

(87) PCT Pub. No.: WO2019/106769
PCT Pub. Date: Jun. 6, 2019

(65) Prior Publication Data
US 2019/0372058 A1    Dec. 5, 2019

(51) Int. Cl.
*H01L 51/56*      (2006.01)
*H01L 27/32*      (2006.01)
(Continued)

(52) U.S. Cl.
CPC ........ *H01L 51/56* (2013.01); *H01L 21/02288* (2013.01); *H01L 22/20* (2013.01);
(Continued)

(58) Field of Classification Search
None
See application file for complete search history.

(56) References Cited

U.S. PATENT DOCUMENTS

| 6,064,456 A | 5/2000 | Taniguchi et al. |
| 2004/0021413 A1 | 2/2004 | Ito et al. |

(Continued)

FOREIGN PATENT DOCUMENTS

| JP | 11-072807 A | 3/1999 |
| JP | 2001-338754 A | 12/2001 |

(Continued)

OTHER PUBLICATIONS

Decision to Grant for related Japanese Application No. 2018-515687 dated Apr. 24, 2018.

(Continued)

*Primary Examiner* — Seahvosh Nikmanesh
(74) *Attorney, Agent, or Firm* — Renner, Otto, Boisselle & Sklar, LLP

(57) ABSTRACT

An organic EL display device (100) including a plurality of pixels includes an element substrate (1) including a substrate, and a plurality of organic EL elements supported by the substrate and respectively located in the plurality of pixels; and a thin film encapsulation structure (10) covering the plurality of pixels. The thin film encapsulation structure includes a first inorganic barrier layer (12), an organic barrier layer (14) in contact with a top surface of the first inorganic barrier layer (12), the organic barrier layer (14) including a plurality of solid portions distributed discretely, and a second inorganic barrier layer (16) in contact with the top surface of the first inorganic barrier layer (12) and top surfaces of the plurality of solid portions of the organic barrier layer (14). The organic barrier layer (14) is black.

11 Claims, 8 Drawing Sheets

(51) Int. Cl.
  *H01L 51/52* (2006.01)
  *H01L 21/02* (2006.01)
  *H01L 21/66* (2006.01)
  *H01L 51/00* (2006.01)

(52) U.S. Cl.
  CPC ...... *H01L 27/3246* (2013.01); *H01L 51/0001* (2013.01); *H01L 51/0097* (2013.01); *H01L 51/5253* (2013.01); H01L 21/0231 (2013.01); H01L 21/0234 (2013.01); H01L 21/02315 (2013.01); H01L 21/02348 (2013.01); H01L 21/02359 (2013.01); H01L 27/3276 (2013.01); H01L 27/3279 (2013.01)

(56) References Cited

U.S. PATENT DOCUMENTS

| | | | |
|---|---|---|---|
| 2010/0227084 A1* | 9/2010 | Kato | C09K 19/32 428/1.1 |
| 2015/0060822 A1 | 3/2015 | Kamiya et al. | |
| 2016/0043346 A1 | 2/2016 | Kamiya et al. | |
| 2016/0126495 A1 | 5/2016 | Oka et al. | |

FOREIGN PATENT DOCUMENTS

| | | |
|---|---|---|
| JP | 2004-071432 A | 3/2004 |
| JP | 2004-351832 A | 12/2004 |
| JP | 2007-328017 A | 12/2007 |
| JP | 2009-199979 A | 9/2009 |
| JP | 2010-211983 A | 9/2010 |
| JP | 2011-090840 A | 5/2011 |
| JP | 2015-030222 A | 2/2015 |
| JP | 2015-050022 A | 3/2015 |
| JP | 2015-220001 A | 12/2015 |
| JP | 2016-039120 A | 3/2016 |
| JP | 2016-105052 A | 6/2016 |
| WO | WO 2014/196137 A1 | 12/2014 |
| WO | WO 2017/033823 A1 | 3/2017 |

OTHER PUBLICATIONS

PCT International Search Report for related International Application No. PCT/JP2017/042912 dated Feb. 13, 2018.

* cited by examiner (a)

(b)

(a)

(b)

(c)

(a)

(b)

METHOD FOR PRODUCING ORGANIC ELECTROLUMINESCENT DISPLAY DEVICE

TECHNICAL FIELD

The present invention relates to an organic EL display device and a method for producing the same.

BACKGROUND ART

Organic EL (Electro-Luminescence) display devices start being put into practical use. One feature of an organic EL display device is being flexible. An organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like for each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed in order to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to provide a sufficient level of barrier property against water vapor with these thin films. From the point of view of the moisture-resistance reliability of the OLED display device, such a thin film encapsulation structure is typically required to have a WVTR (Water Vapor Transmission Rate) lower than, or equal to, $1 \times 10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem that the bendability of the OLED display device is limited.

Patent Document No. 1 discloses a thin film encapsulation structure including a first inorganic material layer, a first resin member and a second inorganic material layer provided on the element substrate in this order, with the first inorganic material layer being closest to the element substrate. In this thin film encapsulation structure, the first resin member is present locally, more specifically, around a protruding portion of the first inorganic material layer (first inorganic material layer covering a protruding portion). According to Patent Document No. 1, the first resin member is present locally, more specifically, around the protruding portion, which may not be sufficiently covered with the first inorganic material layer. With such a structure, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Documents Nos. 2 and 3 also disclose an OLED display device including a similar thin film encapsulation structure.

The thin film encapsulation structure, described in each of Patent Documents Nos. 1 and 2, including an organic barrier layer formed of a resin member that is present locally does not include a thick organic barrier layer, and therefore, is considered to improve the bendability of the OLED display device.

CITATION LIST

Patent Literature

Patent Document No. 1: WO2014/196137
Patent Document No. 2: Japanese Laid-Open Patent Publication No. 2016-39120
Patent Document No. 3: Japanese Laid-Open Patent Publication No. 2015-50022

SUMMARY OF INVENTION Technical Problem

The OLED display device, produced by the method described in each of Patent Documents Nos. 1 and 2, including a thin film encapsulation structure including an organic barrier layer that includes a plurality of solid portions distributed discretely is not necessarily considered to be provided at a high yield.

As described above, in the case where an organic barrier layer is formed by the method described in Patent Document No. 1 or 2, if a surface of the first inorganic material layer includes a protruding portion, the organic barrier layer (solid portion) may be formed only around the protruding portion of the surface of the first inorganic material layer. However, the method for forming the organic barrier layer described in Patent Document No. 1 or 2 merely uses a surface tension of the resin in a liquid state to form the organic barrier layer locally. Therefore, the organic barrier layer may not be formed with certainty in a region where the organic barrier layer needs to be formed. Oppositely, the organic barrier layer may be formed in a region where the organic barrier layer does not need to be formed. The organic barrier layer in the thin film encapsulation structure described in Patent Document No. 1 or 2 is formed of a transparent photocurable resin. Therefore, it is not easily checked whether or not the organic barrier layer is properly formed around the protruding portion of the surface of the first inorganic material layer. In other words, it requires time and/or cost to inspect whether or not the organic barrier layer is formed in a region where the organic barrier layer needs to be formed.

The protruding portion of the surface of the first inorganic material layer is formed by a stepped portion reflecting a line such as, for example, a gate bus line, a source bus line, a lead wire connected with the gate bus line or the source bus line, or the like. Also in the case where a particle (microscopic dust particle) is present above or below the first inorganic material layer, the protruding portion is formed at the surface of the first inorganic material layer.

The present invention, made to solve the above-described problems, has an object of providing an organic EL display device including a thin film encapsulation structure, and a method for producing the same, that improve the yield.

Solution to Problem

An organic EL display device according to an embodiment of the present invention is an organic EL display device including a plurality of pixels. The organic EL display device comprises an element substrate including a substrate, and a plurality of organic EL elements supported by the substrate and respectively located in the plurality of pixels; and a thin film encapsulation structure covering the plurality of pixels. The thin film encapsulation structure includes a first inorganic barrier layer, an organic barrier layer in contact with a top surface of the first inorganic barrier layer, the organic barrier layer including a plurality of solid portions distributed discretely, and a second inorganic barrier layer in contact with the top surface of the first inorganic barrier layer and top surfaces of the plurality of solid portions of the organic barrier layer. The organic barrier layer is black.

In an embodiment, the organic barrier layer contains a dye or a pigment.

In an embodiment, the organic EL display device further includes a bank layer defining each of the plurality of pixels. The bank layer has an inclining surface enclosing each of the plurality of pixels, and the plurality of solid portions include a pixel periphery solid portion extending on the first inorganic barrier layer from an inclining surface thereof to a peripheral area in the pixel.

In an embodiment, the inclining surface of the bank layer has an inclination angle smaller than, or equal to, 60 degrees.

A production method according to an embodiment of the present invention is a method for producing any one of the above-described organic EL display devices. A step of forming the thin film encapsulation structure includes step A of preparing the element substrate having the first inorganic barrier layer formed thereon, step B of forming a liquid film containing a photosensitive resin on the first inorganic barrier layer, step C of irradiating the liquid film with light to form a resin layer, and step D of forming the organic barrier layer, the step D including the step of partially removing the resin layer by a dry process.

In an embodiment, the inclining surface of the first inorganic barrier layer is lyophilic to the liquid film, and a region enclosed by the bank layer is repelling against the liquid film.

In an embodiment, the step D further includes the step of performing a plasma process and/or a corona process.

In an embodiment, the step of forming the thin film encapsulation structure further includes the step of, after the step A and before the step B, performing asking on a surface of the first inorganic barrier layer.

In an embodiment, the step of forming the thin film encapsulation structure further includes the step of, after the step A and before the step B, supplying a silane coupling agent onto the surface of the first inorganic barrier layer.

In an embodiment, the liquid film contains a photocurable resin and a dye or a pigment.

In an embodiment, the liquid film contains a photopolymerizable dye monomer.

In an embodiment, the step B is performed by spraying, spin-coating, slit-coating, screen printing or inkjet printing.

In an embodiment, the step B includes the steps of, after the step A, putting the element substrate into a chamber and supplying a vapor-like or mist-like photocurable resin into the chamber, and condensing the photocurable resin on the first inorganic barrier layer to form the liquid film.

In an embodiment, the production method further includes the steps of, after the step of forming the thin film encapsulation structure, optically acquiring a pattern of the organic barrier layer, and determining whether the thin film encapsulation structure is good or not based on the pattern.

Advantageous Effects of Invention

An embodiment of the present invention provides an organic EL display device including a thin film encapsulation structure, and a method for producing the same, that improve the yield.

BRIEF DESCRIPTION OF DRAWINGS

FIG. 3(a) is a cross-sectional view taken along line 3A-3A' in FIG. 2, FIG. 3(b) is a cross-sectional view taken along line 3B-3B' in FIG. 2, and FIG. 3(c) is a cross-sectional view taken along line 3C-3C' in FIG. 2.

FIG. 6(a) is a cross-sectional view taken along line 6A-6A' in FIG. 5, and FIG. 6(b) is a cross-sectional view taken along line 6B-6B' in FIG. 5.

FIG. 9(a) is a schematic view of a cross-section including a diameter of the particle P (cross-section taken along line 9A-9A' in FIG. 9(b)), and FIG. 9(b) is a plan view as seen in the normal direction.

DESCRIPTION OF EMBODIMENTS

Hereinafter, an organic EL display device and a method for producing the same according to an embodiment of the present invention will be described with reference to the drawings. The embodiments of the present invention are not limited to the embodiments described below as an example.

Figure 1:
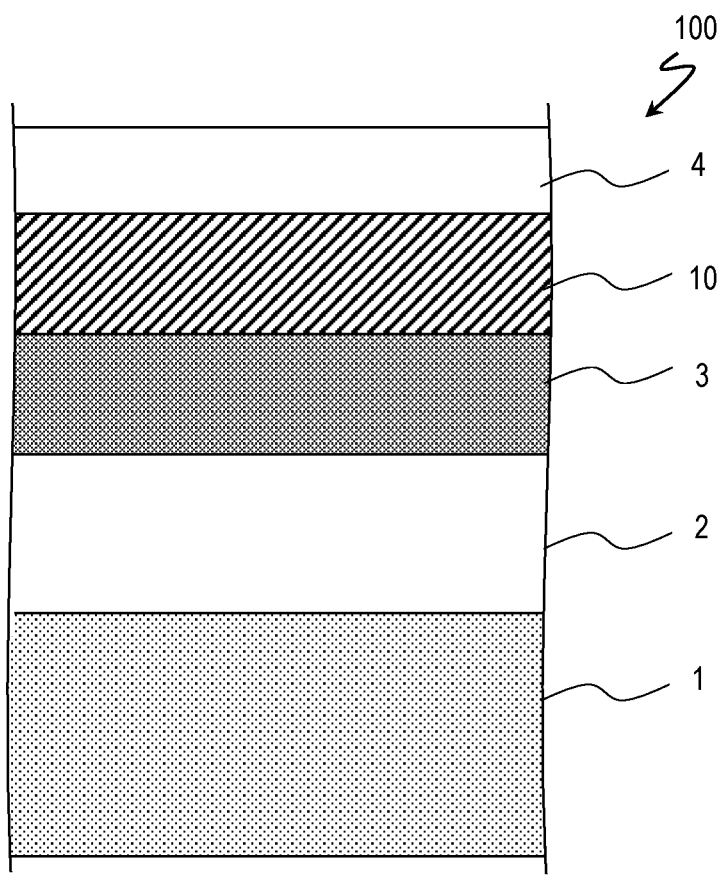
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.
Figure 1:
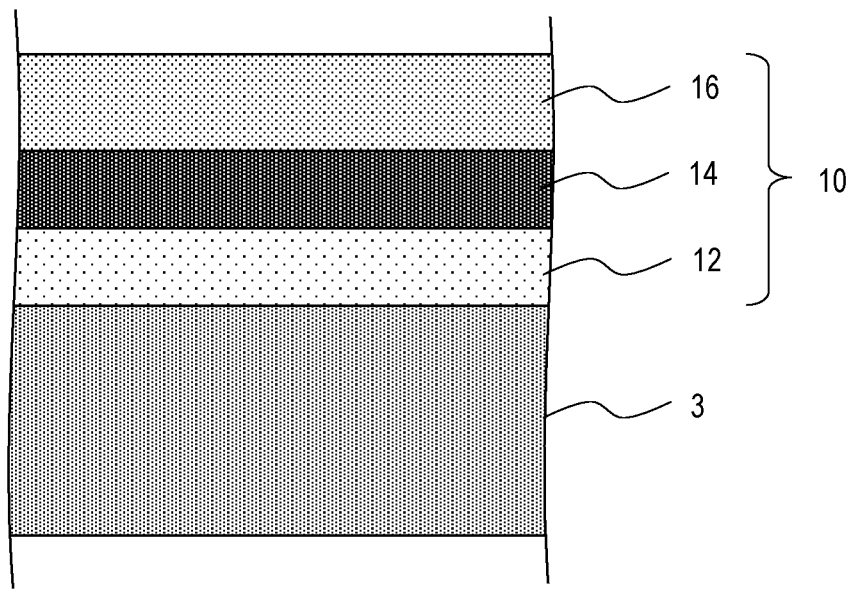

First, with reference to FIG. 1(a) and FIG. 1(b), a basic structure of an OLED display device 100 according to an embodiment of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (back plane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, an upper electrode or a cap layer (refractive index adjusting layer). An optional polarizing plate 4 is located on the TFE structure 10.

The substrate 1 is, for example, a polyimide film having a thickness of 15 μm. The circuit 2 including the TFE has a thickness of, for example, 4 μm. The OLED 3 has a thickness of, for example, 1 μm. The TFE structure 10 has a thickness that is, for example, less than, or equal to, 1.5 μm.

FIG. 1(b) is a partial cross-sectional view of the TFE structure 10 formed on the OLED 3. The TFE structure 10 includes a first inorganic barrier layer (e.g., SiN layer) 12, an organic barrier layer (e.g., acrylic resin layer) 14, and a second inorganic barrier layer (e.g., SiN layer) 16. The first inorganic barrier layer 12 is formed immediately on the OLED 3. The organic barrier layer 14 is in contact with a top surface of the first inorganic barrier layer 12, and includes a plurality of solid portions distributed discretely. The second inorganic barrier layer 16 is in contact with the top surface of the first inorganic barrier layer 12 and top surfaces of the plurality of solid portions of the organic barrier layer 14. The organic barrier layer is black. The organic barrier layer 14 contains, for example, a dye.

Since the organic barrier layer 14 is black, it may be inspected in a short time and/or at low cost whether or not the organic barrier layer 14 is formed in a region where the organic barrier layer 14 needs to be formed. This improves the yield of the OLED display device 100. A method for producing the OLED display device 100 and a method for performing the inspection will be described below.

The organic barrier layer 14 merely needs to be sufficiently colored black to be visually recognizable in an inspection process described below, and does not need to be light-blocking.

The first inorganic barrier layer 12 and the second inorganic barrier layer 16 are each, for example, an SiN layer (e.g., $Si_3N_4$ layer) having a thickness of, for example, 400 nm. The first inorganic barrier layer 12 and the second inorganic barrier layer 16 each have a thickness of 200 nm or greater and 1000 nm or less independently. The thickness of the TFE structure 10 is preferably 400 nm or greater and less than 2 μm, and more preferably 400 nm or greater and less than 1.5 μm. The thickness of the organic barrier layer (solid portion) 14, which depends on the size of the protruding portion of the surface of the first inorganic barrier layer 12 or the size of the particle, may be 1 μm at the maximum. The thickness of the organic barrier layer (solid portion) 14 is typically 200 nm or greater and 500 nm or less.

The TFE structure 10 is formed so as to protect an active region (see the active region R1 in FIG. 2) of the OLED display device 100. As described above, the TFE structure 10 includes, in at least the active region, the first inorganic barrier layer 12, the organic barrier layer 14 and the second inorganic barrier layer 16 in this order, with the first inorganic barrier layer 12 being closest to the OLED 3. The organic barrier layer 14 is not present as a film covering the entirety of the active region, but has openings. Portions of the organic barrier layer 14 where an organic film is actually present, namely, portions except for the openings, will be referred to as "solid portions". The "openings" (may also referred to as "non-solid portions") do not need to be enclosed by the solid portions and may include a cutout portion and the like. In the openings, the first inorganic barrier layer 12 and the second inorganic barrier layer 16 are in direct contact with each other. The openings of the organic barrier layer 14 include at least an opening formed so as to enclose the active region, and the active region is fully enclosed by the portion in which the first inorganic barrier layer 12 and the second inorganic barrier layer 16 are in direct contact with each other (hereinafter, such a portion will be referred to as an "inorganic barrier layer joint portion").

With reference to FIG. 2 through FIG. 6, a structure of, and a method for producing, an OLED display device according to an embodiment of the present invention will be described.

Figure 2:
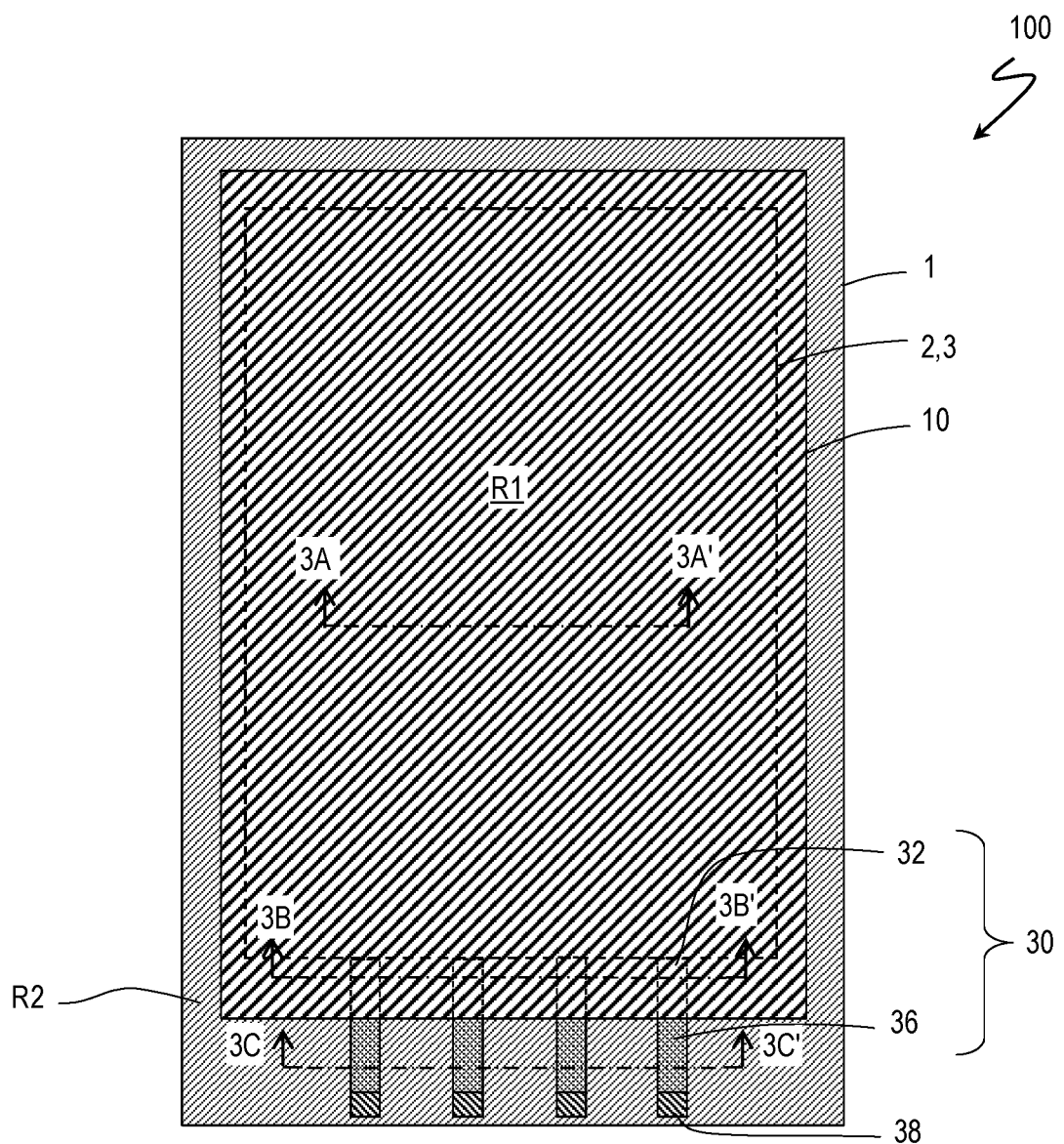
FIG. 2 is a plan view schematically showing a structure of the OLED display device 100 according to an embodiment of the present invention.
Figure 3:
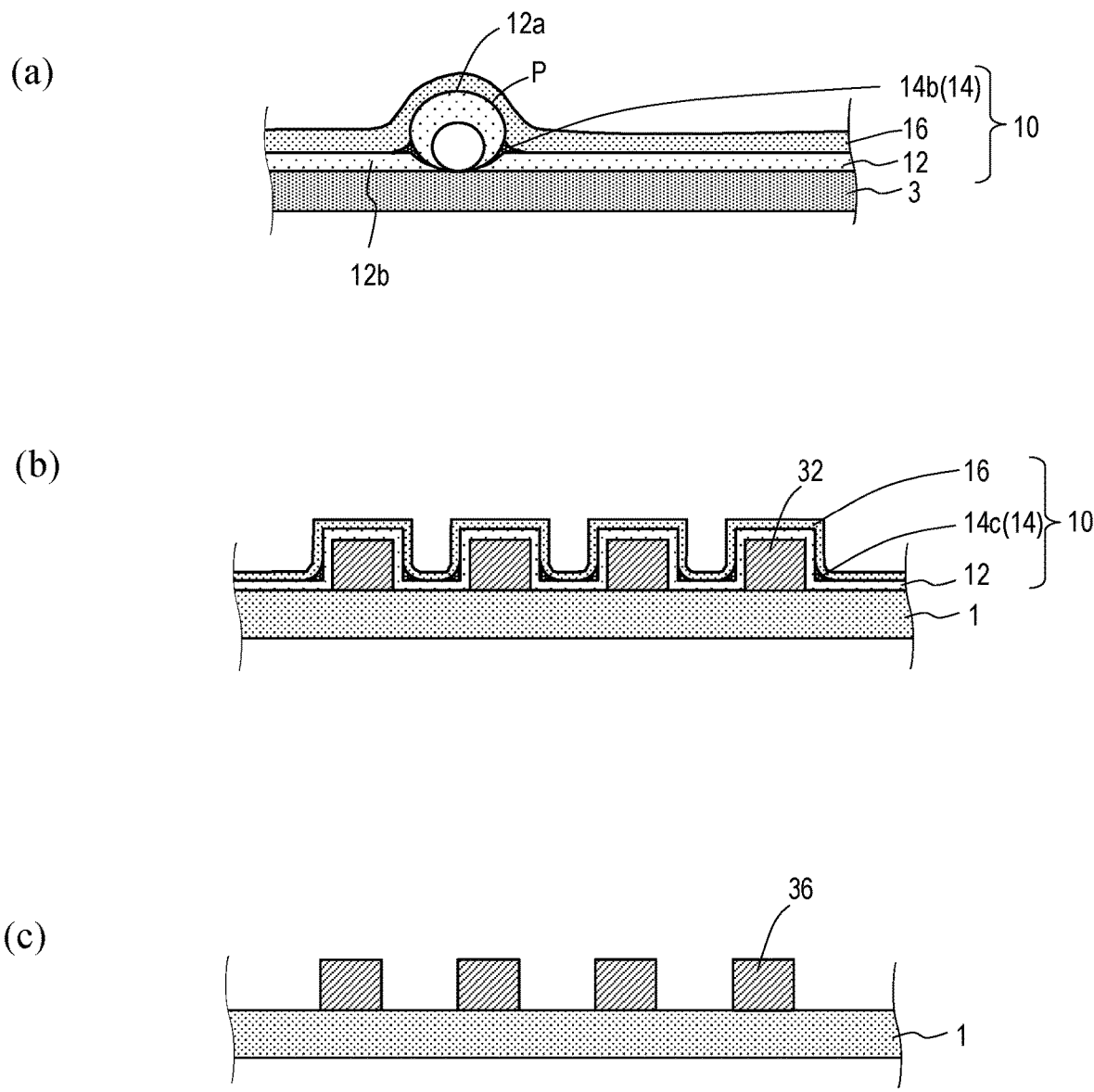
FIG. 3(a) through FIG. 3(c) are each a schematic cross-sectional view of the OLED display device 100.
Figure 4:
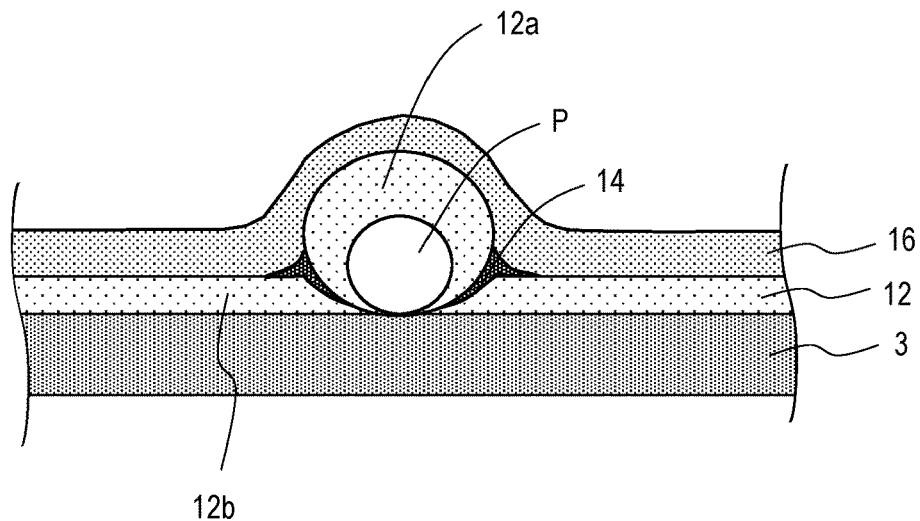
FIG. 4(a) is an enlarged view of a portion including a particle P shown in FIG. 3(a)
FIG. 4(b) is a schematic plan view showing the size relationship among the particle P, a first inorganic barrier layer (SiN layer) covering the particle P, and an organic barrier layer.
FIG. 4(c) is a schematic cross-sectional view of the first inorganic barrier layer covering the particle P.
Figure 4:
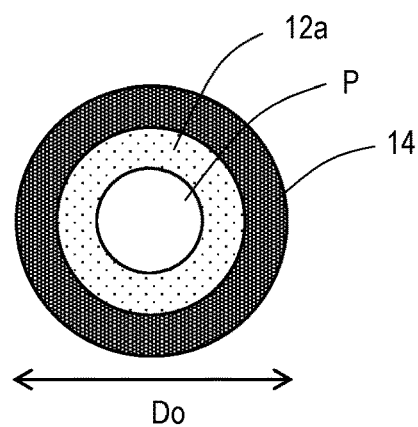
Figure 4:
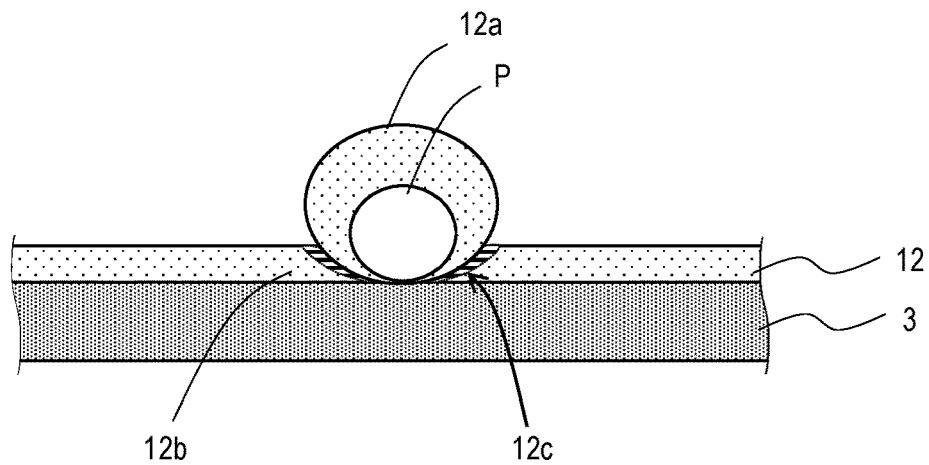

FIG. 2 is a schematic plan view of the OLED display device 100 according to an embodiment of the present invention.

The OLED display device 100 includes the flexible substrate 1, the circuit (back plane) 2 formed on the substrate 1, a plurality of the OLEDs 3 formed on the circuit 2, and the TFE structure 10 formed on the OLEDs 3. A layer including the plurality of OLEDs 3 may be referred to as an "OLED layer 3". The circuit 2 and the OLED layer 3 may share a part of components. The optional polarizing plate (see reference numeral 4 in FIG. 1) may further be located on the TFE structure 10. In addition, for example, a layer having a touch panel function may be located between the TFE structure 10 and the polarizing plate. Namely, the OLED display device 100 may be altered to a display device including an on-cell type touch panel.

The circuit 2 includes a plurality of TFTs (not shown), and a plurality of gate bus lines (not shown) and a plurality of source bus lines (not shown) each connected with either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100 further includes a plurality of terminals 38 located in a peripheral region R2 outer to the active region R1 (region enclosed by the dashed line in FIG. 2), where the plurality of OLEDs 3 are located, and also includes a plurality of lead wires 30 connecting each of the plurality of terminals 38 and either one of the plurality of gate bus lines or either one of the plurality of source bus lines to each other. The TFE structure 10 is formed on the plurality of OLEDs 3 and on a portion of the plurality of lead wires 30 that is close to the active region R1. Namely, the TFE structure 10 covers the entirety of the active region R1 and is also selectively formed on the portion of the plurality of lead wires 30 that is close to the active region R1. Neither a portion of the plurality of lead wires 30 that are closer to the terminals 38, nor the terminals 38, is covered with the TFE structure 10.

Hereinafter, an example in which the lead wires 30 and the terminals 38 are integrally formed in the same conductive layer will be described. Alternatively, the lead wires 30 and the terminals 38 may be formed in different conductive layers (encompassing stack structures).

Now, with reference to FIG. 3(a) through FIG. 3(c), the TFE structure 10 of the OLED display device 100 will be described. FIG. 3(a) is a cross-sectional view taken along line 3A-3A' in FIG. 2. FIG. 3(b) is a cross-sectional view taken along line 3B-3B' in FIG. 2. FIG. 3(c) is a cross-sectional view taken along line 3C-3C' in FIG. 2.

As shown in FIG. 3(a) and FIG. 3(b), the TFE structure 10 includes the first inorganic barrier layer 12 formed on the OLED 3, the organic barrier layer 14, and the second inorganic barrier layer 16 in contact with the first inorganic barrier layer 12 and the organic barrier layer 14. The first inorganic barrier layer 12 and the second inorganic barrier layer 16 are each, for example, an SiN layer, and are selectively formed in a predetermined region so as to cover the active region R1 by plasma CVD by use of a mask. In general, a surface of a layer formed by a thin film deposition method (e.g., CVD, sputtering, vacuum vapor deposition) reflects a stepped portion in an underlying layer. The organic barrier layer (solid portion) 14 is formed only around the protruding portion of the surface of the first inorganic barrier layer 12.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is especially easily generated in the case where mask vapor deposition is used.

As shown in FIG. 3(a), the organic barrier layer (solid portion) 14 includes a portion 14b formed around the particle P. A reason for this is that an acrylic monomer supplied after the first inorganic barrier layer 12 is formed is condensed and present locally, namely, around a surface of a first inorganic barrier layer 12a on the particle P (the surface has a tapering angle larger than 90 degrees). The organic barrier layer 14 includes the opening (non-solid portion) on a flat portion of the first inorganic barrier layer 12.

Now, with reference to FIG. 4(a) through FIG. 4(c), a structure of the portion including the particle P will be described. FIG. 4(a) is an enlarged view of the portion including the particle P shown in FIG. 3(a). FIG. 4(b) is a schematic plan view showing the size relationship among the particle P, the first inorganic barrier layer (SiN layer) 12 covering the particle P and the organic barrier layer 14. FIG. 4(c) is a schematic cross-sectional view of the first inorganic barrier layer covering the particle P.

In the case where the particle P (having a diameter that is, for example, longer than, or equal to, 1 μm) is present, a crack (defect) 12c may be formed in the first inorganic barrier layer as shown in FIG. 4(c). As described below, this is considered to be caused by impingement of the SiN layer 12a growing from a surface of the particle P and an SiN layer 12b growing from a flat portion of a surface of the OLED 3. In the case where such a crack 12c is present, the level of barrier property of the TFE structure 10 is decreased.

In the TFE structure 10 of the OLED display device 100, as shown in FIG. 4(a), the organic barrier layer 14 is formed to fill the crack 12c of the first inorganic barrier layer 12, and a surface of the organic barrier layer 14 couples a surface of the first inorganic barrier layer 12a on the particle P and a surface of the first inorganic barrier layer 12b on the flat portion of the OLED 3 to each other continuously and smoothly. The organic barrier layer 14, which is formed by curing a photocurable resin in a liquid state as described below, has a recessed surface by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may protrude. The organic barrier layer 14 may also be formed with a small thickness on the first inorganic barrier layer 12a on the particle P.

The organic barrier layer (solid portion) 14 having the recessed surface connects the surface of the first inorganic barrier layer 12a on the particle P and the surface of the first inorganic barrier layer 12b on the flat portion to each other continuously and smoothly. Therefore, the second inorganic barrier layer 16 formed thereon is a fine film with no defect. As can be seen, even if the particle P is present, the organic barrier layer 14 keeps high the level of barrier property of the TFE structure 10.

As shown in FIG. 4(b), the organic barrier layer 14 (solid portion) is formed in a ring shape around the particle P. Where the particle P has a diameter (equivalent circle diameter) of about 1 μm as seen in a direction normal to the surface of the OLED 3, the ring-shaped solid portion has a diameter $D_0$ (equivalent circle diameter) that is, for example, longer than, or equal to, 2 μm.

In this example, the organic barrier layer 14 is formed only in a discontinuous portion in the first inorganic barrier layer 12 formed on the particle P, and the particle P is already present before the first inorganic barrier layer 12 is formed on the OLED 3. The particle P may be present on the first inorganic barrier layer 12. In this case, the organic barrier layer 14 is formed only at the border, namely, in a discontinuous portion, between the first inorganic barrier layer 12 and the particle P on the first inorganic barrier layer 12, and thus maintains the barrier property of the TFE structure 10 like in the above-described case. The organic barrier layer 14 may also be formed with a small thickness on the surface of the first inorganic barrier layer 12a on the particle P, or on the surface of the particle P. In this specification, the expression that "the organic barrier layer is present around the particle P" encompasses all these forms.

The organic barrier layer (solid portion) 14 is not limited to being formed as in the example of FIG. 3(a), and may be formed only around the protruding portion of the surface of the first inorganic barrier layer 12 for substantially the same reason. Examples of the other regions where the organic barrier layer (solid portion) 14 may be formed will be described below.

Now, with reference to FIG. 3(b), a structure of the TFE structure 10 on the lead wires 30 will be described. FIG. 3(b) is a cross-sectional view taken along line 3B-3B' in FIG. 2; more specifically, is a cross-sectional view of portions 32, of the lead wires 30, close to the active region R1.

As shown in FIG. 3(b), the organic barrier layer (solid portions) 14 includes portions 14c formed around the protruding portions of the surface of the first inorganic barrier layer 12. The protruding portions reflect the cross-sectional shape of the portions 32 of the lead wires 30.

The lead wires 30 are patterned by the same step as that of, for example, the gate bus lines or the source bus lines. Thus, in this example, the gate bus lines and the source bus lines formed in the active region R1 also have the same cross-sectional structure as that of the portion 32, of each of the lead wires 30, close to the active region R1 shown in FIG. 3(b). It should be noted that typically, a flattening layer is formed on the gate bus lines and the source bus lines formed in the active region R1, and thus no stepped portion is formed at the surface of the first inorganic barrier layer 12 on the gate bus lines and the source bus lines.

The portion 32 of the lead wire 30 may have, for example, a forward tapering side surface portion (inclining side surface portion) having a tapering angle smaller than 90 degrees. In the case where the lead wire 30 includes the forward tapering side surface portion, formation of defects in the first inorganic barrier layer 12 and the second inorganic barrier layer 16 formed on the lead wire 30 is prevented. Namely, the moisture-resistance reliability of the TFE structure 10 is improved. The tapering angle of the forward tapering side surface portion is preferably smaller than, or equal to, 70 degrees.

The active region R1 of the OLED display device 100 is substantially covered with the inorganic barrier layer joint portion, in which the first inorganic barrier layer 12 and the second inorganic barrier layer 16 are in direct contact with each other, except for the regions where the organic barrier layer 14 is selectively formed. Therefore, it does not occur that the organic barrier layer 14 acts as a moisture entrance route to allow the moisture to reach the active region R1 of the OLED display device.

The OLED display device 100 according to an embodiment of the present invention is preferably usable for, for example, medium- to small-sized high-definition smartphones and tablet terminals. In a medium- to small-sized (e.g., 5.7-inch) high-definition (e.g., 500 ppi) OLED display device, it is preferred that lines (encompassing the gate bus lines and the source bus lines) in the active region R1 have a cross-sectional shape, taken in a direction parallel to a line width direction, close to a rectangle (side surfaces of the lines have a tapering angle of about 90 degrees) in order to allow the lines to have a sufficiently low resistance with a limited line width. In order to form the lines having a low resistance, the tapering angle of the forward tapering side surface portion TSF may be larger than 70 degrees and smaller than 90 degrees, or the tapering angle may be about 90 degrees in the entire length of the lines with no forward tapering side surface portion TSF being provided.

Now, FIG. 3(c) will be referred to. FIG. 3(c) is a cross-sectional view of a region where the TFE structure 10 is not formed. In this region, a terminal portion 38 has the same cross-sectional structure as that of portions 36 of the lead wires 30 shown in FIG. 3(c). The portions 36 of the lead wires 30 shown in FIG. 3(c) may have a tapering angle of, for example, about 90 degrees.

Figure 5:
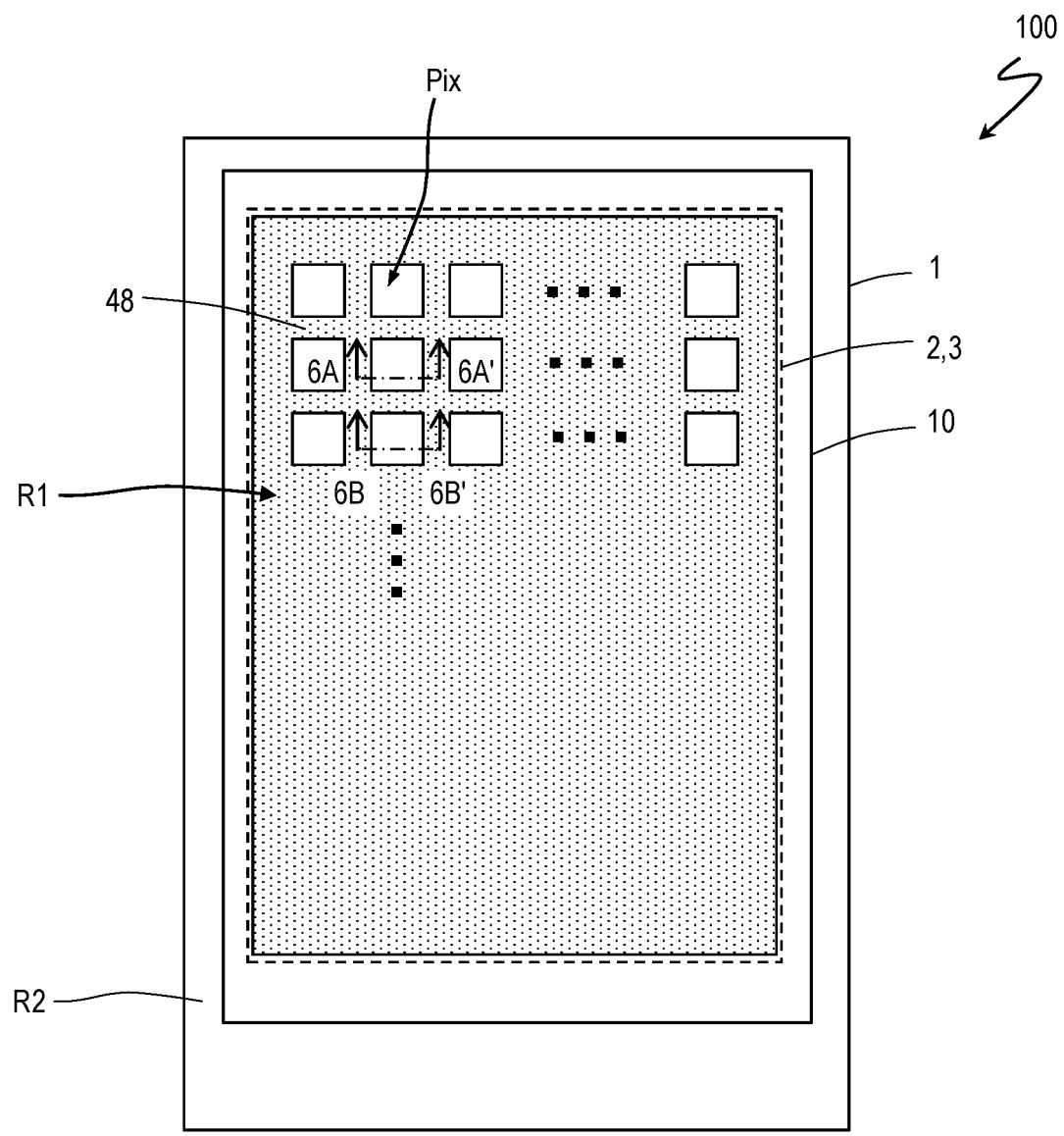
FIG. 5 is a plan view schematically showing a plurality of pixels and a bank layer 48 included in the OLED display device 100.
Figure 6:
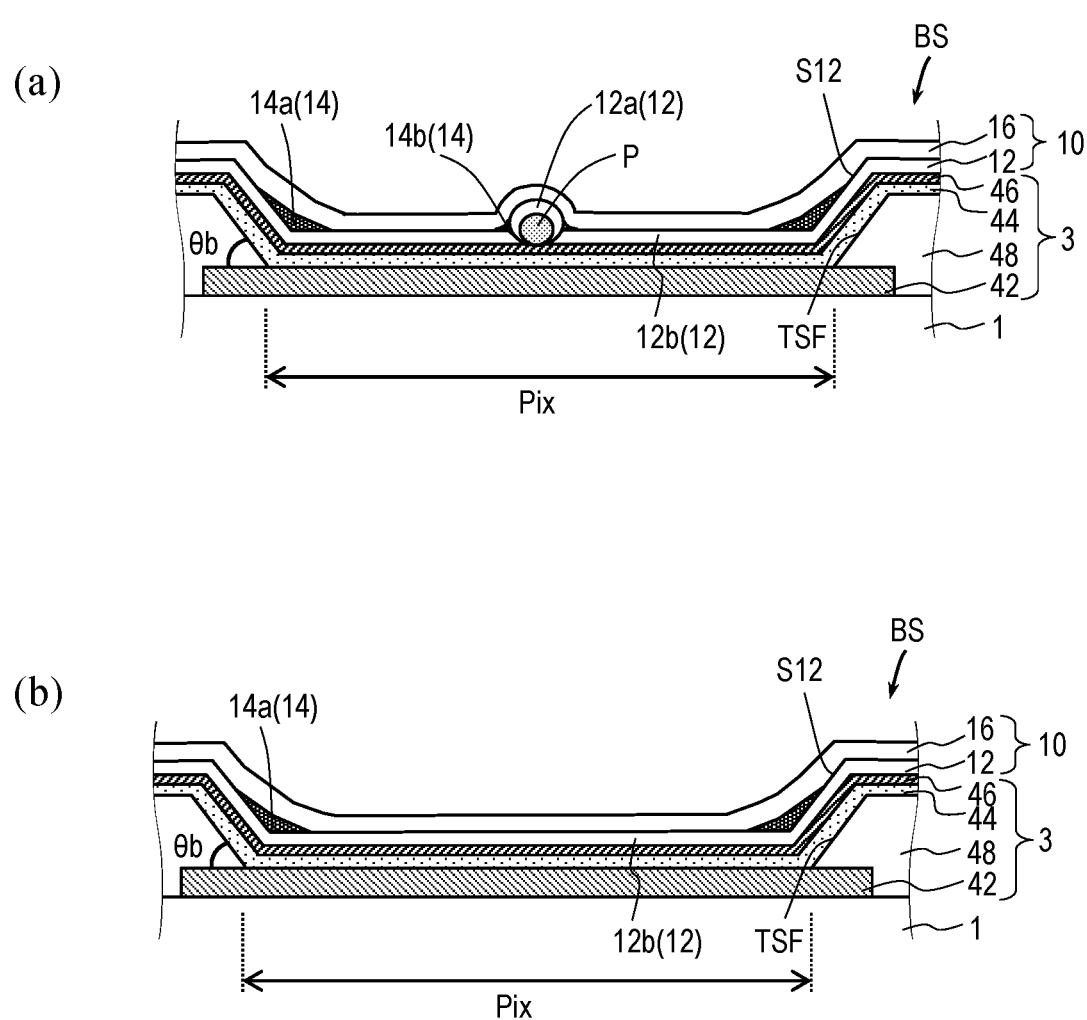
FIG. 6(a) and FIG. 6(b) are each a schematic cross-sectional view of the OLED display device 100.

Now, with reference to FIG. 5 and FIG. 6, the organic barrier layer 14 formed around a bank structure BS will be described. The organic barrier layer (solid portion) 14 is also formed around a protruding portion of the surface of a portion, of the first inorganic barrier layer 12, that is used to form the bank structure BS. FIG. 5 is a plan view schematically showing the plurality of pixels and a bank layer 48 included in the OLED display device 100. FIG. 6(a) and FIG. 6(b) are each a schematic cross-sectional view of the OLED display device 100. FIG. 6(a) is a cross-sectional view taken along line 6A-6A' in FIG. 5, and FIG. 6(b) is a cross-sectional view taken along line 6B-6B' in FIG. 5.

As shown in FIG. 5 and FIG. 6(a), the OLED display device 100 further includes the bank layer 48 defining each of the plurality of pixels. The bank layer 48 has an inclining surface enclosing each of the plurality of pixels. The plurality of solid portions of the organic barrier layer 14 each include a pixel periphery solid portion 14a extending on the first inorganic barrier layer 12 from an inclining surface S12 to a peripheral area in the pixel.

As shown in FIG. 6(a), the bank structure BS includes the bank layer 48 formed of an insulating material (the bank layer may be referred to also as a "PDL (Pixel Defining Layer)"). The bank layer 48 is formed between a lower electrode 42 and an organic layer 44 of the OLED 3. As shown in FIG. 6(a), the OLED 3 includes the lower electrode 42, the organic layer 44 formed on the lower electrode 42, and an upper electrode 46 formed on the organic layer 44. In this example, the lower electrode 42 and the upper electrode 46 respectively act as an anode and a cathode of the OLED 3. The upper electrode 46 is a common electrode formed for the entirety of the pixels in the active region. By contrast, the lower electrode (pixel electrode) 42 is formed for each of the pixels. In the structure in which the bank layer 48 is present between the lower electrode 42 and the organic layer 44, no holes are injected from the lower electrode 42 into the organic layer 44. Therefore, the region where the bank layer 48 is present does not act as a pixel Pix. Thus, the bank layer 48 defines an outer perimeter of the pixel Pix.

As shown in FIG. 5, each pixel Pix is defined by an opening in the bank layer 48. The bank layer 48 is formed to be, for example, lattice-shaped. A side surface of the opening of the bank layer 48 has an inclining surface including the forward tapering side surface portion TSF. The inclining surface of the bank layer 48 encloses each pixel. The bank layer 48 is formed of, for example, a photosensitive resin (e.g., polyimide or acrylic resin). The bank layer 48 has a thickness of, for example, 1 μm to 2 μm. The inclining surface of the bank layer 48 is inclined at an inclination angle θb that is, for example, smaller than, or equal to, 60 degrees. If the inclination angle θb of the inclining surface of the bank layer 48 is larger than 60 degrees, a defect may be caused in layers located on the bank layer 48. The layers located on the bank layer 48 (including, for example, the organic layer 44, the upper electrode 46, the first inorganic barrier layer 12 and the second inorganic barrier layer 16) may be included in the bank structure BS. The layers included in the bank structure BS may each have an inclining surface enclosing each of the plurality of pixels. In the case where each of the layers formed on the bank layer 48 is thinner than the bank layer 48, the inclination angle of the inclining surface of the bank structure BS is considered to be substantially equal to the inclination angle of the inclining surface of the bank layer 48. The first inorganic barrier layer 12 is included in the bank structure BS, and has the inclining surface S12 enclosing each of the plurality of pixels. The organic barrier layer (solid portion) 14 includes the pixel periphery solid portion 14a extending on the first inorganic barrier layer 12 from the inclining surface S12 to a peripheral area in the pixel.

As shown in, for example, FIG. 6(a), in a central area of the pixel, the organic barrier layer 14 is formed only in a discontinuous portion formed in the first inorganic barrier layer 12 by the particle P. Namely, as shown in FIG. 6(b), the organic barrier layer 14 is not present in a central area, of the pixel, where no particle P is present. The OLED display device with no particle P does not include the organic barrier layer in the central area of the pixel. A particle P having a size (equivalent spherical diameter) of approximately 0.3 µm or longer and 5 µm or shorter declines the moisture-resistance reliability of the TFE structure 10. It should be noted that a particle P having a size of 0.2 µm or longer and shorter than 0.3 µm may also decline the moisture-resistance reliability. A particle P having a size shorter than 0.2 µm is considered to have substantially no possibility of declining the moisture-resistance reliability. A particle having a size longer than 5 µm is removed by cleaning or the like.

A board of G4.5 (730 mm×920 mm) may have, for example, several tens to about 100 particles each having a size of approximately 0.3 µm or longer and 5 µm or shorter. One OLED display device (active region) may have approximately several particles. Needless to say, there are OLED display devices with no particle P. The organic barrier layer 14 is formed of, for example, a cured photocurable resin. A portion where the photocurable resin is actually present is referred to as a "solid portion". As described above, the organic barrier layer 14 (solid portion) is selectively formed only around a protruding portion of the surface of the first inorganic barrier layer 12.

As shown in, for example, FIG. 6(a), in the case where there is a particle P in the central area of the pixel, the organic barrier layer 14 is formed in a discontinuous portion formed by the particle P. As described above with reference to FIG. 4(b), the organic barrier layer (solid portion) 14 is formed in a ring shape around the particle P. Where the particle P has a diameter (equivalent circle diameter) of, for example, about 1 µm as seen in a direction normal to the surface of the OLED 3, the ring-shaped solid portion has a diameter $D_0$ (equivalent circle diameter) that is, for example, longer than, or equal to, 2 µm. In the case of, for example, a 5.7-inch display device having 2560×1440 pixels (about 500 ppi), the pixel pitch is 49 µm. The size of the particle P and the size of the organic barrier layer (solid portion) 14 formed around the particle P are sufficiently smaller than the pixel pitch. Therefore, a change in the transmittance caused by the barrier layer 14 (solid portion) formed around the particle P does not have a significant influence on the display.

Now, with reference to FIG. 6(a) and FIG. 6(b), a further advantage provided by the black organic barrier layer 14 included in the OLED display device 100 will be described.

Patent Document No. 3 discloses a thin film encapsulation structure including an organic barrier layer (may be referred to as a "flattening layer"; for example, an acrylic resin layer) formed selectively around an inclining surface of a bank structure. Patent Document No. 3 does not disclose a colored organic barrier layer. According to the studies made by the present inventors, unless the colored organic barrier layer is formed, the luminous intensity distribution (viewing angle dependence) of light output from the pixel may be changed by the formation of the organic barrier layer (solid portion) around the inclining surface of the bank structure. When the size, shape or the like of the organic barrier layer is different, the intensity or the luminous intensity distribution of the light output from a periphery of the pixel is different. As a result, a problem that the luminous intensity distribution of light is different among the pixels is caused.

By contrast, as shown in FIG. 6(a) and FIG. 6(b), the OLED display device 100 according to an embodiment of the present invention includes the organic barrier layer (solid portion) 14 colored black and extending from the inclining surface of the bank structure BS to a peripheral area in the pixel. Therefore, the light output from the periphery of the pixel is decreased. This uniformizes the luminous intensity distributions of the light output from the pixels. As shown in FIG. 6(a), the OLED display device 100 also includes the organic barrier layer (solid portion) 14 around the particle P. Therefore, the light is suppressed from leaking from the vicinity of the particle P.

The organic barrier layer 14 merely needs to effectively absorb light output in an oblique direction (e.g., absorb 70% or greater of the light) in order to provide the above-described effect. The organic barrier layer 14 may be formed of, for example, a black resist usable for a black matrix of a color filter layer of a known display device. However, the organic barrier layer 14 does not necessarily need to have a level of light-blocking property required of a black matrix (e.g., OD value of about 3 to 4/µm).

Now, a method for producing an OLED display device according to an embodiment of the present invention will be described.

A step of forming the TFE structure 10 in the OLED display device according to an embodiment of the present invention includes the following steps.

Step A: step of preparing an element substrate having the first inorganic barrier layer 12 formed thereon Step B: step of forming a liquid film containing a photosensitive resin on the first inorganic barrier layer 12

Step C: step of irradiating the liquid film with light to form a resin layer

Step D: step of forming the organic barrier layer 14, including a step of partially removing the resin layer by a dry process Step D is optional and may be omitted. For example, as described below, mask exposure may be performed at the time of curing the photocurable resin to form the organic barrier layer 14.

As an example, a method for forming the organic barrier layer 14 by use of the method described in Patent Document No. 1 or 2 will be described. Regarding the method for forming the organic barrier layer, the disclosures of Patent Documents Nos. 1 and 2 are incorporated herein by reference.

Step B includes a step of, after step A, putting the element substrate into a chamber and supplying a vapor-like or mist-like photocurable resin (e.g., acrylic monomer) into the chamber, and a step of condensing the photocurable resin on the first inorganic barrier layer 12 to form the liquid film. Namely, a vapor-like or mist-like organic material is supplied onto the element substrate maintained at a temperature lower than, or equal to, room temperature in the chamber, and is condensed on the element substrate. Thus, the organic material put into a liquid state is located locally, more specifically, at the border between the side surface of the protruding portion and the flat portion of the surface of the first inorganic barrier layer 12 by a capillary action or a surface tension of the organic material.

In the case where step B is performed by the method described in Patent Document No. 1 or 2, the liquid film formed in step B contains, for example, a photocurable resin (e.g., ultraviolet-curable resin) and a black dye. The black dye may be a known dye. The black dye may contain a photopolymerizable dye monomer. The black dye is generally a mixture of a plurality of dyes (compounds) of different colors.

Next, step C is performed. More specifically, the organic material is irradiated with, for example, ultraviolet rays to form the photocurable resin layer (e.g., acrylic resin layer). The photocurable resin layer formed in this step typically includes a plurality of solid portions distributed discretely. Substantially no solid portion is present on the flat portion of the surface of the first inorganic barrier layer 12. Even if the organic material is present on the flat portion of the surface of the first inorganic barrier layer 12, the amount (e.g., thickness) thereof is smaller than the amount around the protruding portion of the surface of the first inorganic barrier layer 12. Therefore, the resin layer, once formed, may be asked in, for example, a subsequent step (step D) to remove the organic material from the flat portion of the surface of the first inorganic barrier layer 12. As a result, the organic barrier layer (solid portion) 14 is formed locally, more specifically, only around the protruding portion of the surface of the first inorganic barrier layer 12. In order to form the organic barrier layer 14 in this manner, the thickness of the liquid film to be formed and/or the asking conditions (including time) may be appropriately adjusted when necessary, in addition to the above.

Alternatively, selective exposure such as mask exposure or the like may be performed at the time of curing the photocurable resin. For example, mask exposure may be performed, so that the inorganic barrier layer joint portion, where the first inorganic barrier layer 12 and the second inorganic barrier layer 16 are in direct contact with each other, is formed. An opening of the organic barrier layer 14 is formed in a region corresponding to a light-blocking portion of the photomask. Therefore, for example, the photocurable resin layer may be exposed via a photomask including a light-blocking portion formed so as to enclose the active region, so that the organic barrier layer 14 having an opening formed so as to enclose the active region is provided.

Then, step D is performed when necessary to form the organic barrier layer (solid portion) 14 located locally, more specifically, only around the protruding portion of the surface of the first inorganic barrier layer 12. Step D includes a step of partially removing the photocurable resin layer by a dry process. For example, a relatively thick portion of the photocurable resin layer is left without being fully removed. The expression "remove an organic material by a dry process" indicates removing an organic material from the surface by ashing or by a dry process other than ashing (e.g., by sputtering). The expression "remove an organic material by a dry process" encompasses removing the organic material entirely and removing the organic material partially (e.g., from the surface to a certain depth). The "dry process" refers to a process that is not a wet process using a liquid such as a release liquid, a solvent or the like.

Patent Document No. 1 or 2 does not disclose or suggest a step of partially removing a photocurable resin layer by a dry process. This step enlarges a margin for the formation of the organic barrier layer. Namely, an organic barrier layer (photocurable resin layer) is once formed in a region larger (wider) than the region where the organic barrier layer needs to be formed, and the resultant organic barrier layer is partially removed. In this manner, the organic barrier layer is formed only in the region where the organic barrier layer needs to be formed. This improves the yield.

Ashing oxidizes and thus removes an organic material. Ashing is used also to remove an organic material attached to a surface of an inorganic film. Ashing is used to remove the organic material entirely and also to remove the organic material partially (e.g., from a surface to a certain depth). Ashing may be performed in, for example, an atmosphere containing at least one of $N_2O$, $O_2$ and $O_3$. Ashing is roughly classified into plasma ashing (or corona discharge) using plasma generated by treating any one of the above-described types of atmospheric gas at a high frequency, and photo-excited ashing of irradiating atmospheric gas with light such as ultraviolet rays or the like. Ashing may be performed by use of, for example, a known plasma ashing device, a known ashing device using corona discharge, a known photo-excited ashing device, a known UV ozone ashing device or the like. In the case where an SiN film is formed by CVD as each of the first inorganic barrier layer 12 and the second inorganic barrier layer 16, $N_2O$ is used as material gas. Therefore, use of $N_2O$ for ashing provides an advantage of simplifying the ashing device.

Ashing results in shaving the surface the organic barrier layer 14 substantially uniformly, and also oxidizing the surface the organic barrier layer 14 to modify the surface of the organic barrier layer 14 to be hydrophilic. Ashing also results in forming extremely tiny concaved and convexed portions to increase the surface area size of the organic barrier layer 14. The effect of ashing of increasing the surface area size is greater for the surface of the organic barrier layer 14 than for the first inorganic barrier layer 12 formed of an inorganic material. Since the surface of the organic barrier layer 14 is modified to be hydrophilic and the surface area size thereof is increased, the adhesiveness between the organic barrier layer 14 and the second inorganic barrier layer 16 is improved.

In order to improve the adhesiveness between the first inorganic barrier layer 12 and the organic barrier layer 14, the surface of the first inorganic barrier layer 12 may be exposed to plasma ashing (e.g., plasma process and/or corona process) or to photo-excited ashing before the organic barrier layer 14 is formed. Namely, the step of forming the TFE structure 10 may further include a step of, after step A and before step B, performing plasma ashing (e.g., plasma process and/or corona process) or photo-excited ashing. Such a step provides an advantage that the side surface of the protruding portion of the surface of the first inorganic barrier layer 12 is modified to be lyophilic to the liquid film formed in step B, or that the degree of the lyophilic property of the side surface is improved. Alternatively, the surface of the flat portion of the first inorganic barrier layer 12 may be modified to be repelling against the liquid film formed in step B. For example, the inclining surface S12 of the first inorganic barrier layer 12 of the bank structure BS (see FIG. 6(*a*) and FIG. 6(*b*)) may be lyophilic to the liquid film formed in step B, whereas the region enclosed by the bank structure BS may be repelling against the liquid film formed in step B.

The above-described modification of the surface may also be realized by, for example, a silane coupling agent (hydrophilic or hydrophobic). Namely, the step of forming the TFE structure 10 may further include a step of, after step A and before step B, supplying a silane coupling agent onto the surface of the first inorganic barrier layer 12. Either the step of supplying the silane coupling agent or the step of asking may be performed. Alternatively, after the surface of the first inorganic barrier layer 12 is asked, the silane coupling agent may be supplied. Supply of the silane coupling agent may modify the surface of the first inorganic barrier layer 12 to be hydrophilic or hydrophobic.

Still alternatively, for example, a photolithography process may be used to modify a particular region of the surface to be hydrophilic or hydrophobic by use of a silane coupling agent. For example, the inclining surface S12 of the first inorganic barrier layer 12 of the bank structure BS may be modified to be lyophilic to the liquid film, whereas the region enclosed by the bank structure BS may be modified to be repelling against the liquid film.

Step D may further include a step of performing plasma ashing (e.g., plasma process and/or corona process) or photo-excited ashing. This step removes the organic material from the surface of the flat portion of the first inorganic barrier layer 12 more certainly.

As described above, the active region of the OLED display device 100 according to an embodiment of the present invention is fully enclosed by the inorganic barrier layer joint portion, where the first inorganic barrier layer 12 and the second inorganic barrier layer 16 are in direct contact with each other. With such a structure, the OLED display device 100 has a higher level of moisture-resistance reliability than an OLED display device including an organic barrier layer formed by the method described in Patent Document No. 1 or 2.

According to the studies made by the present inventors, in the case where the organic barrier layer is formed by the method described in Patent Document No. 1 or 2, there may be a problem that a sufficiently high level of moisture-resistance reliability is not provided. This problem has been found to be caused by water vapor in the air reaching the active region (may also be referred to as an "element formation region" or a "display region") on the element substrate via the organic barrier layer.

In the case where an organic barrier layer is formed by printing such as inkjet printing or the like, the organic barrier layer may be adjusted to be formed only in the active region (may also be referred to as an "element formation region" or a "display region") on the element substrate but not in a region other than the active region. Therefore, there is a region where the first inorganic barrier layer and the second inorganic barrier layer are in direct contact with each other around the active region (outer to the active region). The organic barrier layer is fully enclosed by the first inorganic barrier layer and the second inorganic barrier layer and is isolated from the outside of the first inorganic material layer and the second inorganic material layer.

By contrast, with the method for forming the organic barrier layer described in Patent Document 1 or 2, a resin (organic material) is supplied onto the entire surface of the element substrate, and the surface tension of the resin in a liquid state is used to locate the resin locally, more specifically, at the border between the surface of the substrate and the side surface of the protruding portion on the surface of the element substrate. Therefore, the organic barrier layer may also be formed in a region other than the active region (the region other than the active region may also be referred to as a "peripheral region"), namely, in a terminal region, where the plurality of terminals are located, and in a lead wire region, where the lead wires extending from the active region to the terminal region are formed. Specifically, the resin is present locally, more specifically, at, for example, the border between the side surfaces of the lead wires and the terminals and the surface of the substrate. In this case, an end of the organic barrier layer formed along the lead wires is not enclosed by the first inorganic barrier layer or the second inorganic barrier layer, but is exposed to the air (ambient atmosphere). The organic barrier layer is lower in the barrier property against water vapor than the inorganic material layers (inorganic barrier layers). Therefore, the organic barrier layer formed along the lead wires acts as a route that leads the water vapor in the air to the active region.

With the production method according to an embodiment of the present invention, as described above, the openings of the organic barrier layer 14 include an opening formed so as to enclose at least the active region, and the active region is fully enclosed by the inorganic barrier layer joint portion, where the first inorganic barrier layer 12 and the second inorganic barrier layer 16 are in direct contact with each other. Therefore, the organic barrier layer does not act as a route that leads the water vapor in the air to the active region.

The organic barrier layer 14 of the OLED display device 100 according to an embodiment of the present invention is not limited to being formed by the above-described method, and may be formed by, for example, spraying, spin-coating, slit-coating, screen printing or inkjet printing. Namely, step B may be performed by spraying, spin-coating, slit-coating, screen printing or inkjet printing. In the case where such a method is used, a photosensitive resin (positive or negative) may be used as well as a photocurable resin (negative). In the case where a positive photosensitive resin is used, a photomask having an opening corresponding to a region where the inorganic barrier layer joint portion is to be formed is used.

In the case where any of such methods is used, the liquid film (a material containing a photosensitive resin used to form the liquid film may be referred to as a "coating liquid") is not limited to a dye and may contain a pigment. A known black pigment, for example, carbon black, may be used. Usable as a photosensitive resin (e.g., photocurable resin) having black pigment dispersed therein is, for example, a black resist usable for a black matrix of a color filter layer of a liquid crystal display device. The organic barrier layer merely needs to be sufficiently colored black to be visually recognizable in an inspection process described below, and does not necessarily need to have a light-blocking property require of a black matrix (e.g., OD value of about 3 to 4/μm). As described above, the thickness of the organic barrier layer 14 is less than, or equal to, 1 μm, typically, 200 nm or greater and 500 nm or less. Therefore, even a usual photosensitive resist for a black matrix may be sufficiently exposed to light (e.g., cured) with an exposure amount of, for example, 150 mJ/cm$^2$ or less. As the black pigment, a mixture of a plurality of pigments of different colors may be used.

In the case where the organic barrier layer 14 is formed by inkjet printing, the organic barrier layer (solid portion) may be selectively formed only in a particular region. Therefore, the inorganic barrier layer joint portion is formed with no mask exposure. Even with printing such as screen printing, inkjet printing or the like, the resultant organic barrier layer 14 is thinner than a relatively thick organic barrier layer having a thickness of about 5 μm to about 20 μm, which is used for a thin film encapsulation structure of an OLED display device currently commercially available. In this case, the photosensitive resin to be used is photo-curable (i.e., negative).

In the case where the organic barrier layer is formed by inkjet printing, a region to which the coating liquid is to be supplied needs to be specified. Therefore, the method for producing the OLED display device in an embodiment includes a foreign object detection step and an inkjet printing step.

Figure 7:
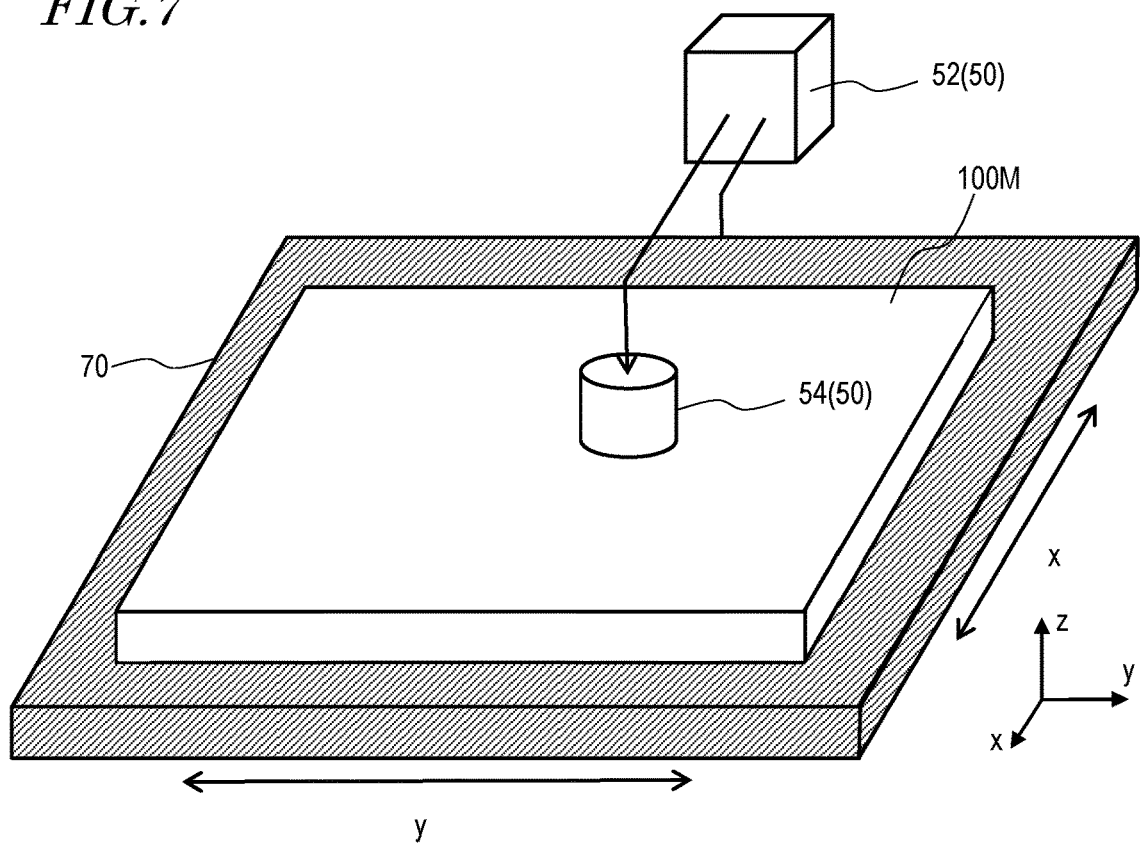
FIG. 7 is a schematic view showing a foreign object detection device 50 usable for a method for producing an OLED display device according to an embodiment of the present invention.
Figure 8:
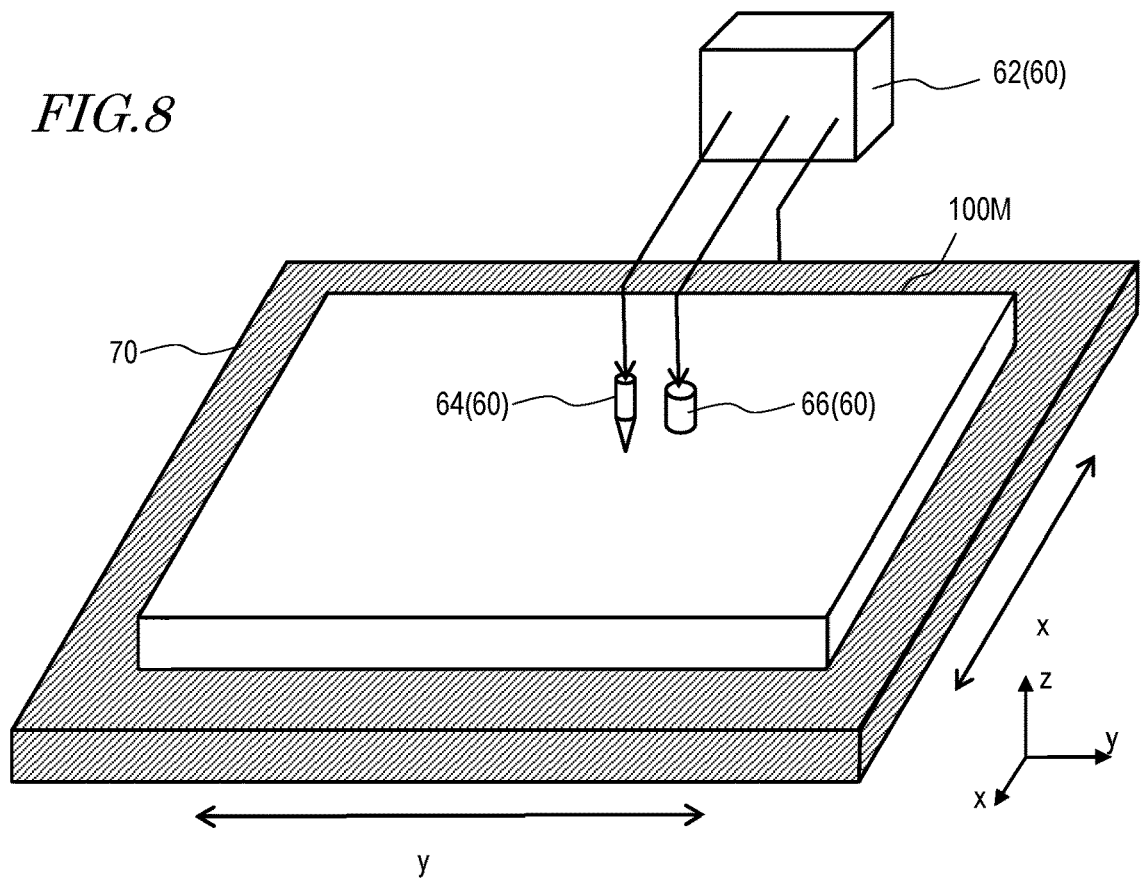
FIG. 8 is a schematic view showing an inkjet device 60 usable for the method for producing an OLED display device according to an embodiment of the present invention.

FIG. 7 is a schematic view showing a foreign object detection device 50 usable for the method for producing an OLED display device according to an embodiment of the present invention. FIG. 8 is a schematic view showing an inkjet device 60 usable for the method for producing an OLED display device according to an embodiment of the present invention.

The foreign object detection device 50 shown in FIG. 7 includes a controller 52 and a detection head 54. The controller 52 controls an operation of the detection head 54 and also controls an operation of a stage 70. The stage 70 is capable of receiving a substrate 100M and transporting the substrate 100M in an x-axis direction and a y-axis direction.

The stage 70 is capable of, for example, attracting and securing the substrate 100M, and/or transporting the substrate 100M in a floating state (contactless transportation). The substrate 100M is an element substrate formed by use of a G4.5 mother board, and includes the components up to the first inorganic barrier layer.

The controller 52 includes a memory and a processor (neither is shown), and controls the operation of the detection head 54 and/or the stage 70 in accordance with information stored on the memory, such that the detection head scans on the substrate 100M. A signal to control the detection head 54 and/or the stage 70 to operate is generated by the processor and supplied to the detection head 54 and/or the stage 70 via an interface (represented by the arrow in the figure).

The detection head 54 includes, for example, a laser light source (e.g., semiconductor laser element), an image-forming optical system, and an image-capturing element (none of these components is shown). Laser light is directed toward a predetermined position on the substrate 100M, and the light scattered by the substrate 100M is caused, by the image-forming optical system, to form an image on a light receiving surface of the image-capturing element. Regarding the result of image-capturing performed by the image-capturing element, the processor finds whether or not there is a particle, the size of the particle, and the like in accordance with a predetermined algorithm, and stores the obtained results on the memory. Such a foreign object inspection device is described in, for example, Japanese Laid-Open Patent Publication No. 2016-105052. The entirety of the disclosure of Japanese Laid-Open Patent Publication No. 2016-105052 is incorporated herein by reference. As the foreign object inspection device 50, for example, HS-930 produced by Toray Engineering Co., Ltd. is preferably usable. HS-930 is capable of detecting a foreign object having a size of 0.3 µm (evaluation performed by scattering standard particles). HS-930 is capable of inspecting a G4.5 board in a time period shorter than 60 seconds.

The standard particles are true sphere polystyrene latex particles. The actual particle P is a microscopic piece of broken glass, a metal particle or an organic particle (organic EL material), and is covered with an SiN layer (refractive index: about 1.8; second inorganic barrier layer). Therefore, the actual particle P is more easily detectable than the standard particle. With the above-described foreign object inspection device using scattered laser light, a foreign object having an equivalent spherical diameter of 0.2 µm or longer is detected.

The inkjet device 60 shown in FIG. 8 includes a controller 62, an inkjet head 64, and a UV (ultraviolet) irradiation head 66.

The controller 62 includes a memory and a processor (neither is shown), and controls the operation of the inkjet head 64, the irradiation head 66 and/or the stage 70 in accordance with information stored on the memory, such that the inkjet head 64 and the UV irradiation head 66 move to a desired position on the substrate 100M.

A signal to control the inkjet head 64, the UV irradiation head 66 and/or the stage 70 to operate is generated by the processor and supplied to the inkjet head 64, the UV irradiation head 66 and/or the stage 70 via interfaces (represented by the arrows in the figure). For example, position information (e.g., xy coordinates), on the position at which the particle is present, stored on the memory of the controller 52 of the foreign object detection device 50 is received by the controller 62. Based on the position information, microscopic liquid drops of the coating liquid containing the photocurable resin are supplied from the inkjet head 64. The amount of the coating liquid (the number of the microscopic liquid drops, namely, the number of shots) supplied from the inkjet head 64 is, for example, found by the processor based on size information on the particle stored on the memory of the controller 52 of the foreign object detection device 50 and received by the controller 62.

Then, the UV irradiation head 66 directs ultraviolet rays to, and thus cures, the supplied photocurable resin to form the organic barrier layer. This operation is performed on each of the particles.

FIG. 8 shows the inkjet head 64 and the UV irradiation head 66 as being separate from each other. Alternatively, the inkjet head 64 and the UV irradiation head 66 may be provided as one head. An LED or a semiconductor laser element may be used as an ultraviolet source, so that the UV irradiation device 66 is realized as a compact device including a light source itself. Alternatively, the UV irradiation device 66 may include only an output end of an optical fiber and a lens unit provided when necessary. In this case, as an ultraviolet source that emits ultraviolet rays toward an input end of the optical fiber, an LED, a semiconductor laser or any of various other ultraviolet sources (e.g., lamp sources such as, for example, a mercury xenon lamp, a super-high pressure mercury lamp and the like) is usable. In consideration of the combining efficiency, it is preferred to use a light source capable of oscillating laser light, for example, an LED, a semiconductor laser element or the like. In the case where the UV irradiation head 66 and an ultraviolet source are located separately from each other, there is an advantage that in a series of steps including the detection of a foreign object, the supply of a coating liquid and the irradiation with ultraviolet rays, the influence exerted by heat generation caused by the light source on the OLED 3 in the substrate 100M is decreased.

Alternatively, for example, a plurality of inkjet heads may be prepared. For example, two or more inkjet heads generating different sizes of microscopic liquid drops may be prepared, so that different inkjet heads are used for particles of different sizes.

For example, the inkjet head 64 preferably usable may generate microscopic liquid drops each having a volume of the order of 1 fL (1 fL or larger and smaller than 10 fL) or may generate microscopic liquid drops each having a volume smaller than 1 fL. 1 fL corresponds to a volume of a sphere having a diameter of about 1.2 µm, and 0.1 fL corresponds to a volume of a sphere having a diameter of about 0.6 µm. For example, the inkjet device (Super Inkjet (registered trademark)) produced by SIJ Technology Inc., capable of injecting 0.1 fL microscopic liquid drops, is preferably usable.

Figure 9:
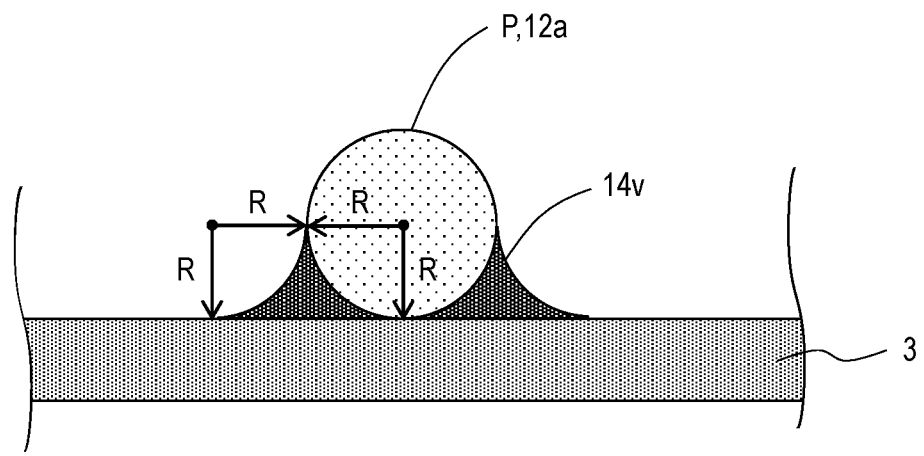
FIG. 9 shows schematic views provided to describe a preferred range of volume of an organic barrier layer to be formed around the particle P in an OLED display device according to an embodiment of the present invention.
Figure 9:
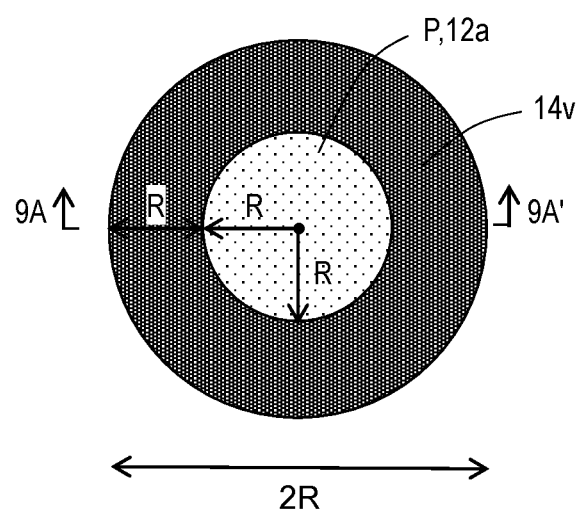

Now, with reference to FIG. 9(*a*) and FIG. 9(*b*), the volume of the organic barrier layer (solid portion) to be formed around the particle P and a preferred size of the microscopic liquid drops used to form the organic barrier layer will be described. FIG. 9(*a*) and FIG. 9(*b*) are schematic views provided to describe a preferred range of the volume of the organic barrier layer to be formed around the particle P in the OLED display device according to an embodiment of the present invention. FIG. 9(*a*) is a cross-sectional view taken along line 9A-9A' in FIG. 9(*b*), and is a schematic view of a cross-section including a diameter of the particle P. FIG. 9(*b*) is a plan view as seen in a direction normal to the surface of the OLED.

Now, it is assumed that the particle P or the first inorganic barrier layer 12*a* formed to cover the particle P (the particle P and the first inorganic barrier layer 12a formed to cover the particle P may be collectively referred to as a "protruding portion by the particle P") is spherical. An organic barrier layer 14v around the particle P may be formed to cover the particle P and/or the inorganic barrier layer 12a on the particle P. However, if the organic barrier layer 14v is too thick, the protruding portion by the particle P may be visually recognized by a refraction function (lens effect) of the organic barrier layer 14v. Therefore, it is preferred that as shown in FIG. 9(a), the organic barrier layer 14v is formed only in a region of a radius R of the protruding portion by the particle P, namely, from the bottom to the center of the protruding portion. The organic barrier layer 14v provided in this manner may be formed by adjusting the volume of the coating liquid to be supplied (in the case where the coating liquid contains a solvent, the volume of the solid content) and/or by adjusting the asking conditions (e.g., time). Ashing will be described below.

Assuming that a recessed surface of the organic barrier layer 14v is a curved surface having a radius of curvature that is the same as the radius R of the protruding portion by the particle P, the volume $V_0$ of the organic barrier layer 14v shown in FIG. 9(a) and FIG. 9(b) is represented by the following expression (1).

$$V_0 = (4 - \pi)\pi R^3 \quad (1)$$

When the radius R of the protruding portion by the particle P is 0.15 μm, $V_0$ is about 0.009 fL. When the radius R is 0.25 μm, $V_0$ is about 0.04 fL. When the radius R is 2.5 μm, $V_0$ is about 42 fL.

It is preferred that the volume of the organic barrier layer 14v is larger than, or equal to, about a half of $V_0$. If the volume of the organic barrier layer 14v is smaller than this range, the formation of the organic barrier layer 14v may prevent formation of the second inorganic barrier layer 16 with a fine film with no defect. The upper limit of the volume of the organic barrier layer 14v may be a level at which the protruding portion by the particle P is not visually recognized by the refraction function (lens effect). The upper limit preferably does not exceed five times of $V_0$, and preferably does not exceed twice of $V_0$. In the case where the radius R of the protruding portion by the particle P is shorter than 2.5 μm (in the case where $V_0$ is smaller than about 42 fL), the volume of the organic barrier layer 14v is not limited to the above-described range. The volume of the organic barrier layer 14v is merely required not to exceed about 200 fL, and is preferably smaller than, or equal to, about 100 fL.

It is preferred that the size of the microscopic liquid drops is appropriately set in accordance with the radius R of the protruding portion by the particle P. It is preferred that, for example, the size of the microscopic liquid drops is set such that one to three drops satisfy $V_0$. A solvent may be incorporated into the coating liquid, so that the microscopic liquid drops are made large with respect to the solid content in the coating liquid (amount left as the organic barrier layer 14v in a final state) (the size of the microscopic liquid drops may be increased to, for example, a range from a size exceeding 1 time the original size to a size 10 times the original size).

A protruding portion, by the particle P, having a diameter shorter than 0.2 μm (having a radius R shorter than 0.1 μm) is considered to have substantially no influence on the moisture-resistance reliability even if the organic barrier layer 14v is not provided. Therefore, it is merely needed to detect protruding portions, by the particle P, having a diameter of 0.2 μm or longer (having a radius R of 0.1 μm or longer) and form the organic barrier layer 14v in corresponding portions.

It is not efficient to supply a microscopic liquid drop of 0.1 fL a great number of times for a particle P having a diameter of 5 μm (having a radius R of 2.5 μm). Therefore, for example, an inkjet head generating microscopic liquid drops smaller than 1 fL (e.g., 0.1 fL) and an inkjet head generating microscopic liquid drops of 10 fL or larger and smaller than 0.5 pL (e.g., 50 fL) may be prepared, so that one of the inject heads is selected in accordance with the size of the particle P. The UV irradiation head 66 is commonly usable. Needless to say, three or more inkjet heads generating microscopic liquid drops of different sizes may be prepared.

As described above, the portion 14b of the organic barrier layer 14 may be formed around the particle P. By contrast, the pixel periphery solid portion 14a, of the organic barrier layer 14, extending on the first inorganic barrier layer 12 from the inclining surface S12 to a peripheral area in the pixel, is more efficiently formed by use of an inkjet head that generates microscopic liquid drops of 10 fL or larger and smaller than 100 pL (e.g., 200 fL). The position of the pixel periphery solid portion 14a is determined in advance. Therefore, an inkjet device may be separately prepared, and the pixel periphery solid portion 14a may be formed in accordance with the design data.

A coating liquid containing a photocurable resin (monomer) contains a photoinitiator (radical polymerization initiator or cationic polymerization initiator) and also a small amount of additive such as a surfactant or the like. The photocurable resin is contained in the coating liquid at a content of about 80% by mass to about 90% by mass, and the photoinitiator is contained at a content of about 5% by mass to about 10% by mass. A pigment or a dye may be incorporated into the coating liquid. In the case of a pigment is incorporated, a dispersant may also be incorporated. A preferred viscosity is, for example, about 0.5 mPa or higher and 10 Pa·s. In the case where a dye or a pigment is incorporated, it is easily checked whether or not the organic barrier layer (solid portion) has been formed at a desired position. The pigment needs to be put into microscopic pieces, which raises the viscosity. Therefore, it is preferred to use a dye. In the case where, for example, microscopic liquid drops of 0.1 fL are to be generated, it is preferred that the coating liquid does not contain a pigment or a dye. In order to adjust the viscosity or the size (volume) of the microscopic liquid drops, a solvent (e.g., an organic solvent such as alcohol or the like) may be incorporated.

Usable as the photocurable resin may be a radical polymerizable monomer containing a vinyl group such as an acrylic resin (acrylate monomer), or a cationic polymerizable monomer containing an epoxy group. An appropriate photoinitiator is selected in accordance with the type of the resin to be used and the wavelength range of the UV light to be directed. Instead of using the UV irradiation head 66, an ultraviolet irradiation device such as a high pressure mercury lamp, a super-high pressure mercury lamp or the like may be used to, for example, irradiate the entirety of the photocurable resin on the substrate 100M with ultraviolet rays at the same time. The amount of the ultraviolet rays to be directed (exposure amount), which depends on the thickness of the organic barrier layer 14 to be formed, is, for example, 50 mJ/cm$^2$ or larger and 200 mJ/cm$^2$ or smaller, preferably 100 mJ/cm$^2$ or larger and 150 mJ/cm$^2$ or smaller, with i line of 365 nm.

The production method described above includes a step in which a photocurable resin (organic material) heated and vaporized to be vapor-like or mist-like is supplied onto an element substrate maintained at a temperature lower than, or equal to, room temperature and is condensed on the element substrate, so that the organic material put into a liquid state is located locally, more specifically, at the border between the side surface of the protruding portion and the flat portion of the surface of the first inorganic barrier layer by use of a capillary action or a surface tension of the organic material. With this production method, the photocurable resin needs to be once vaporized. In this case, it is preferred that the photocurable resin does not contain a pigment. The viscosity of the photocurable resin, at room temperature (e.g., 25° C.) before the photocurable resin is cured, preferably does not exceed 10 Pa·s, and especially preferably is 1 to 100 mPa·s. If the viscosity is too high, it may be difficult to form a thin film having a thickness of 500 nm or less.

The production method may further include a step of partially ashing the photocurable resin layer formed by curing the photocurable resin. Ashing may be performed by use of a known plasma ashing device, a known ashing device using corona discharge, a known photo-excited ashing device, a known UV ozone ashing device or the like. Ashing may be performed, for example, by plasma ashing using at least one type of gas among $N_2O$, $O_2$ and $O_3$, or by a combination of plasma ashing and ultraviolet irradiation. In the case where an SiN film is formed by CVD as each of the first inorganic barrier layer 12 and the second inorganic barrier layer 16, $N_2O$ is used as material gas. Therefore, use of $N_2O$ for ashing provides an advantage of simplifying the ashing device.

Ashing results in oxidizing the surface the organic barrier layer 14 to modify the surface the organic barrier layer 14 to be hydrophilic. In addition, ashing results in shaving the surface the organic barrier layer 14 substantially uniformly and forming extremely tiny concaved and convexed portions to increase the surface area size of the organic barrier layer 14. The effect of ashing of increasing the surface area size is greater for the surface of the organic barrier layer 14 than for the first inorganic barrier layer 12 formed of an inorganic material. Since the surface of the organic barrier layer 14 is modified to be hydrophilic and the surface area size thereof is increased, the adhesiveness between the organic barrier layer 14 and the second inorganic barrier layer 16 is improved.

In order to improve the adhesiveness between the first inorganic barrier layer 12 and the organic barrier layer 14, the surface of the first inorganic barrier layer 12 may be exposed to plasma ashing before the organic barrier layer 14 is formed.

Ashing results in, for example, removing the photocurable resin formed on the protruding portion by the particle P to adjust the location and/or the volume of the organic barrier layer 14 left in a final state, and also results in improving the adhesiveness between the organic barrier layer 14 and the second inorganic barrier layer 16.

The method for producing the OLED display device according to an embodiment of the present invention may further include, after the step of forming the thin film encapsulation structure, a step of optically acquiring a pattern of the organic barrier layer 14 and a step of determining whether the thin film encapsulation structure is good or not based on the pattern. Since the black organic barrier layer 14 is formed, it may be determined whether the thin film encapsulation structure is good or not based on the pattern of the organic barrier layer optically acquired. Such an inspection process may be easily inlined. This improves the yield.

Specifically, a pattern of a region, of the element substrate having the first inorganic barrier layer formed thereon, on which the organic barrier layer (solid portions) is to be formed (such a pattern is also referred to as a "design pattern" or a "target pattern") is prepared. From the element substrate having the organic barrier layer 14 formed thereon, the pattern of the organic barrier layer (solid portions) is optically acquired by use of, for example, an image capturing device. The acquired pattern of the organic barrier layer (solid portions) is compared against the design pattern (target pattern), and thus it is determined whether or not the organic barrier layer (solid portions) has been formed in the predetermined region. With the method for producing the organic EL display device according to an embodiment of the present invention, the organic barrier layer is black. Therefore, the pattern of the organic barrier layer may be acquired optically with high precision. Naturally, the design pattern does not include a pattern of the organic barrier layer (solid portions) to be formed in correspondence with the particles. However, in the case where a pattern matching the design pattern is formed, if the particles are present, it is presumed that the organic barrier layer (solid portions) corresponding to the particles has also been formed. Therefore, the yield is improved as compared with a case where no inspection is made regarding the state of formation of the organic barrier layer. The determination is made with higher precision or in a shorter time as compared with a case where a transparent organic barrier layer is formed.

It may also be inspected whether or not an organic barrier layer corresponding to the particles has been formed. For example, foreign objects on the element substrate are detected by the foreign object detection device before the organic barrier layer is formed, and data including position information on the foreign objects (mapping) and image information on a microscopic region including each of the foreign objects (light intensity distribution) is acquired. After the organic barrier layer is formed on the element substrate, a foreign object inspection is performed in substantially the same manner by use of the foreign object detection device, and substantially the same type of data is acquired. The data before the formation of the organic barrier layer and the data after the formation of the organic barrier layer may be compared against each other to determine whether or not the organic barrier layer corresponding to each of the particles has been formed. With the method for producing the organic EL display device according to an embodiment of the present invention, the organic barrier layer is black. Therefore, the image information (light intensity distribution) is significantly changed by the formation of the organic barrier layer. For this reason, the determination is made with higher precision or in a shorter time as compared with a case where a transparent organic barrier layer is formed.

INDUSTRIAL APPLICABILITY

Embodiments of the present invention are applicable to an organic EL display device, especially, a flexible organic EL display device, and a method for producing the same.

REFERENCE SIGNS LIST 1 flexible substrate
2 back plane (circuit)
3 organic EL element
4 polarizing plate
10 thin film encapsulation structure (TFE structure)

12 first inorganic barrier layer
14 organic barrier layer
16 second inorganic barrier layer
30 lead wire
42 lower electrode
44 organic layer
46 upper electrode
48 bank layer
50 foreign object detection device
52 controller
54 detection head
60 inkjet device
62 controller
64 inkjet head
66 UV irradiation head
100 organic EL display device

The invention claimed is:

1. A method for producing an organic electroluminescent display device,
the organic electroluminescent display device including:
a plurality of pixels;
an element substrate including a substrate, and a plurality of organic electroluminescent elements supported by the substrate and respectively located in the plurality of pixels; and
a thin film encapsulation structure covering the plurality of pixels,
wherein the thin film encapsulation structure includes a first inorganic barrier layer, an organic barrier layer in contact with a top surface of the first inorganic barrier layer, the organic barrier layer including a plurality of solid portions distributed discretely, and a second inorganic barrier layer in contact with the top surface of the first inorganic barrier layer and top surfaces of the plurality of solid portions of the organic barrier layer,
the method comprising a step of forming the thin film encapsulation structure,
wherein the step of forming the thin film encapsulation structure comprises:
step A of preparing the element substrate having the first inorganic barrier layer formed thereon,
step B of forming a liquid film containing a photosensitive resin on the first inorganic barrier layer,
step C of irradiating the liquid film with light to form a resin layer, and
step D of forming the organic barrier layer, the step D including the step of partially removing the resin layer by a dry process,
wherein the organic barrier layer is black,
wherein the inclining surface of the first inorganic barrier layer is lyophilic to the liquid film, and
wherein a region enclosed by the bank layer is repelling against the liquid film.

2. The method of claim 1, wherein the organic barrier layer contains a dye or a pigment.

3. The method of claim 1, wherein the inclining surface of the bank layer has an inclination angle smaller than, or equal to, 60 degrees.

4. The method of claim 1, wherein the step D further includes the step of performing a plasma process and/or a corona process.

5. The method of claim 1, wherein the step of forming the thin film encapsulation structure further includes the step of, after the step A and before the step B, performing ashing on a surface of the first inorganic barrier layer.

6. The method of claim 1, wherein the step of forming the thin film encapsulation structure further includes the step of, after the step A and before the step B, supplying a silane coupling agent onto the surface of the first inorganic barrier layer.

7. The method of claim 1, wherein the liquid film contains a photocurable resin and a dye or a pigment.

8. The method of claim 1, wherein the liquid film contains a photopolymerizable dye monomer.

9. The method of claim 1, wherein the step B is performed by spraying, spin-coating, slit-coating, screen printing or inkjet printing.

10. The method of claim 1, wherein the step B includes the steps of:
after the step A, putting the element substrate into a chamber and supplying a vapor-like or mist-like photocurable resin into the chamber, and
condensing the photocurable resin on the first inorganic barrier layer to form the liquid film.

11. The method of claim 1, further comprising the steps of, after the step of forming the thin film encapsulation structure:
optically acquiring a pattern of the organic barrier layer, and
determining whether the thin film encapsulation structure is good or not based on the pattern.

* * * * *